United States Patent
Genden et al.

(10) Patent No.: US 7,844,849 B2
(45) Date of Patent: Nov. 30, 2010

(54) SYSTEM AND METHOD FOR IDENTIFYING AND MANIPULATING LOGIC ANALYZER DATA FROM MULTIPLE CLOCK DOMAINS

(75) Inventors: Michael Joseph Genden, Austin, TX (US); John Fred Spannaus, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 11/757,450

(22) Filed: Jun. 4, 2007

(65) Prior Publication Data

US 2008/0301500 A1 Dec. 4, 2008

(51) Int. Cl.
*G06F 1/04* (2006.01)
(52) U.S. Cl. ............................ 713/500; 713/501
(58) Field of Classification Search ................ 713/375, 713/400, 500, 600
See application file for complete search history.

(56) References Cited

U.S. PATENT DOCUMENTS

2005/0273671 A1* 12/2005 Adkisson et al. .............. 714/43

* cited by examiner

*Primary Examiner*—Nitin C Patel
(74) *Attorney, Agent, or Firm*—VanLeeuwen & VanLeeuwen; Matthew B. Talpis

(57) ABSTRACT

A system and method for identifying and manipulating logic analyzer data from multiple clock domains is presented. A logic analyzer receives debug data and determines whether the debug data is a full frequency data type, a half frequency data type, or a crossed data type. Once determined, the logic analyzer reconstructs the debug data such that debug condition-matching logic may process the reconstructed data in a full frequency domain. For half frequency data types, the logic analyzer adds masked data values to the data in order to reconstruct the data into to the full frequency domain before processing the data. For crossed data types, the logic analyzer reconstructs the data into its original format before processing the data in a full frequency domain.

19 Claims, 10 Drawing Sheets

600 →

Figure 1:
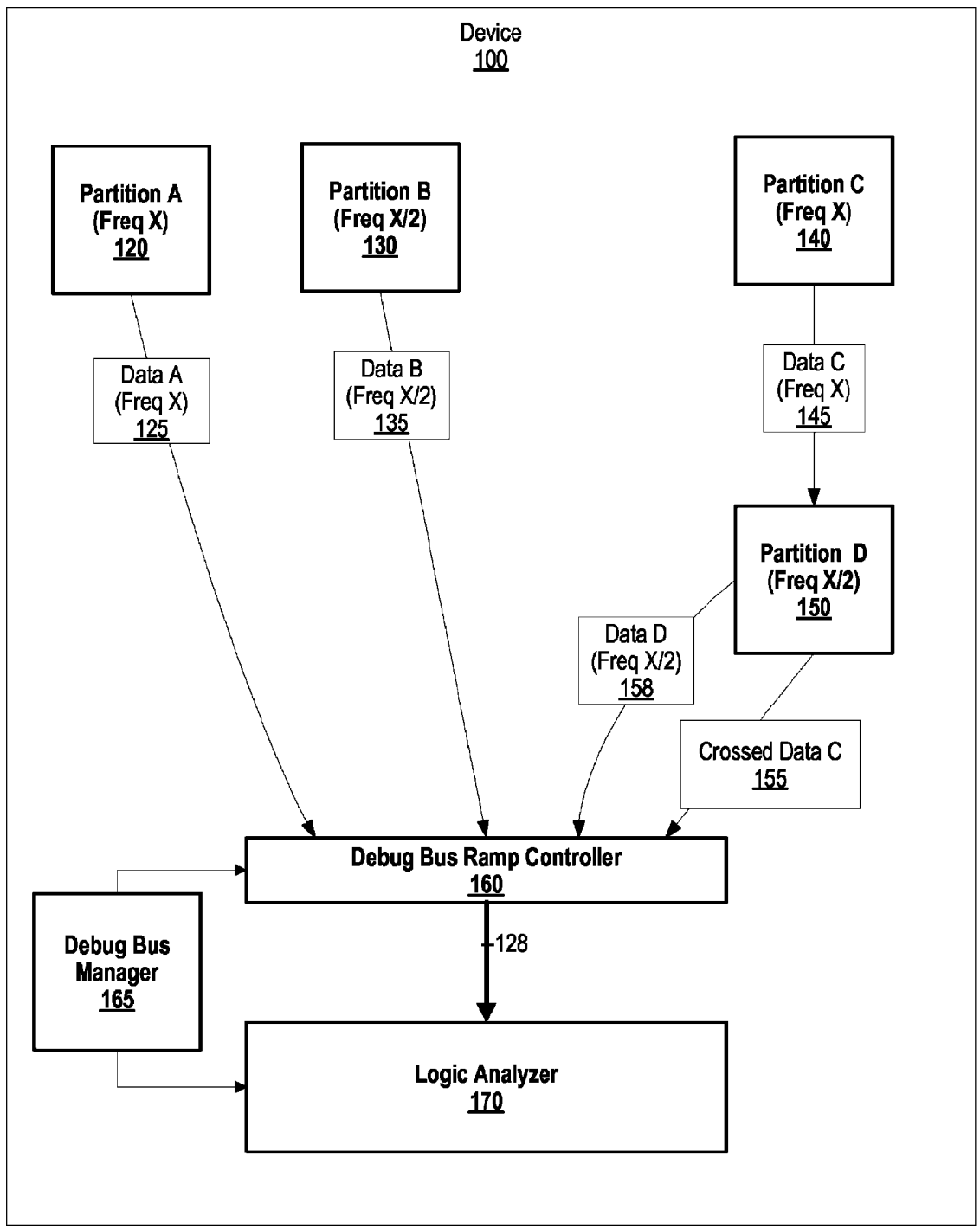

| | Bus Segment 0 | Bus Segment 1 | Bus Segment 2 | Bus Segment 3 |
|---|---|---|---|---|
| | 605 | 610 | 615 | 620 |
| 625 | Partition A word 0 | Partition A word 1 | Partition A word 2 | Partition A word 3 |
| 630 | Partition B word 0 | Partition B word 1 | Partition B word 2 | Partition B word 3 |
| 635 | Partition C word 0 phase A | Partition C word 0 phase B | Partition C word 1 phase A | Partition C word 1 phase B |
| 640 | Partition D word 0 | Partition D word 1 | Partition D word 2 | Partition D word 3 |

FIG. 6A

650 →

| | TA data (0:31) | TA data (32:63) | TA data (64:95) | TA data (96:127) |
|---|---|---|---|---|
| | 655 | 660 | 665 | 670 |
| 675 | Partition A word 0 | Partition A word 1 | Partition A word 2 | Partition A word 3 |
| 680 | Partition B word 0 | Partition B word 1 | Partition B word 2 | Partition B word 3 |
| 685 | Partition C word 0 | 0 | Partition C word 1 | 0 |
| 690 | Partition D word 0 | Partition D word 1 | Partition D word 2 | Partition D word 3 |

FIG. 6B

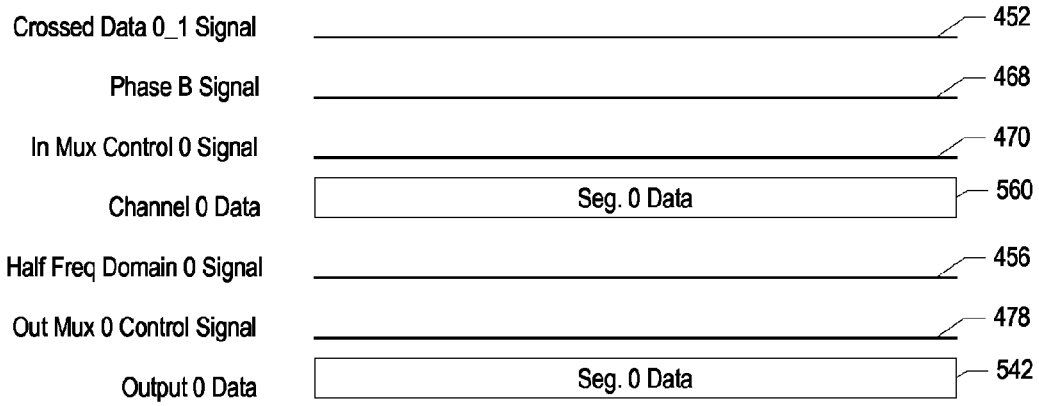
FIG. 9A *(Full Frequency Data Type)*
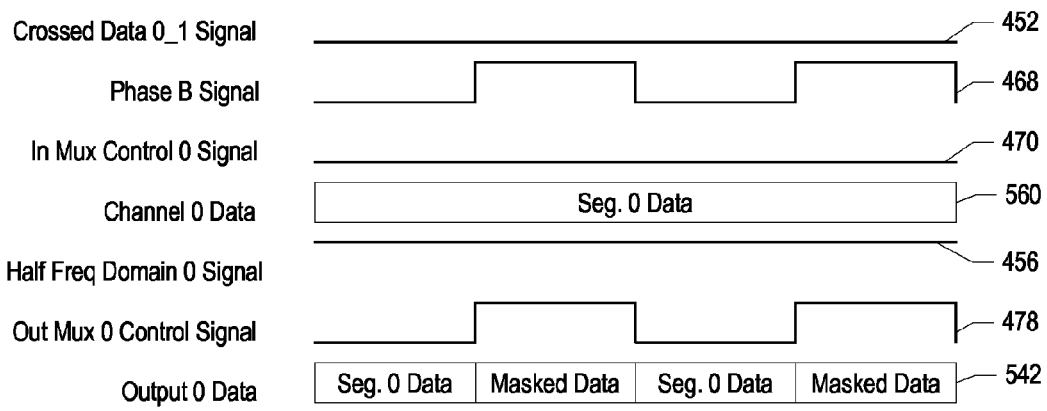
FIG. 9B *(Half Frequency Data Type)*
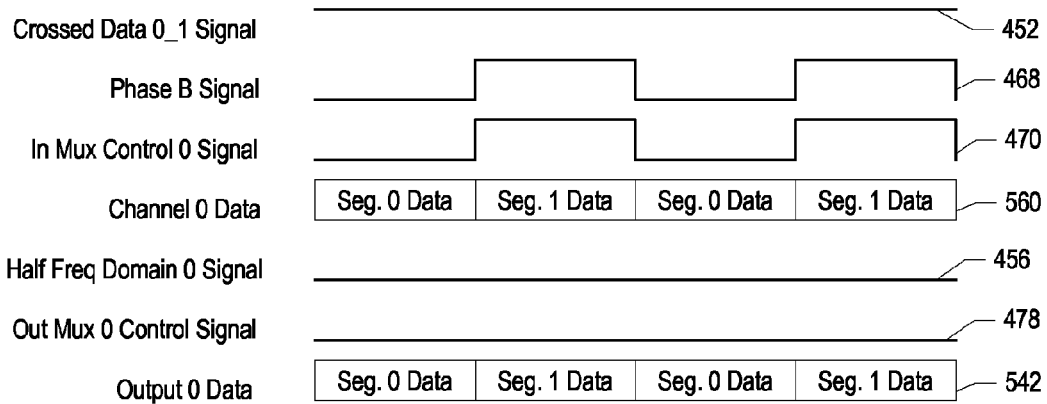
FIG. 9C *(Crossed Data Type)*

Figure 10:
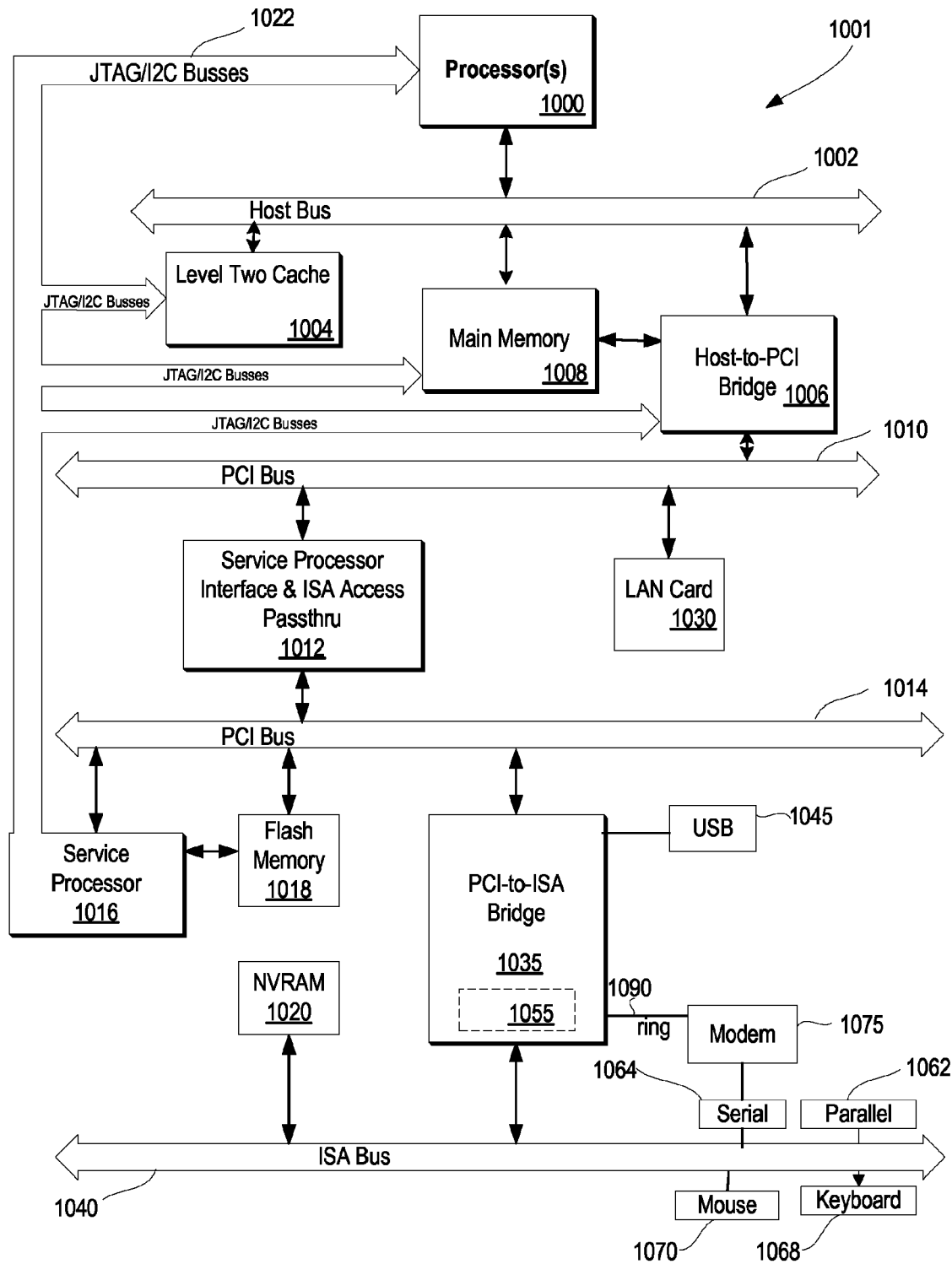

SYSTEM AND METHOD FOR IDENTIFYING AND MANIPULATING LOGIC ANALYZER DATA FROM MULTIPLE CLOCK DOMAINS

BACKGROUND OF THE INVENTION

1. Technical Field

The present invention relates to a system and method for identifying and manipulating logic analyzer data from multiple clock domains. More particularly, the present invention relates to a system and method for reconstructing debug data that originates in a half frequency domain, or passes through a half frequency domain, in order to process the debug data in a full frequency domain.

2. Description of the Related Art

A device may include multiple frequency domains that operate at different clock rates. Each domain produces debug data on a debug bus at a rate equivalent to its particular clock rate, which proceeds to a centralized internal logic analyzer. When the debug data crosses a boundary from a faster domain to a slower domain, the data undergoes a transformation on the debug bus in order to preserve the data. For example, a 32-bit debug word originating from an N frequency domain spreads into 64 bits of data when crossing to a N/2 frequency domain. In this example, data from even-numbered cycles may be assigned to bits 0:31, and data from odd-numbered cycles may be assigned to bits 32:63. A challenge found is that when the data arrives at the logic analyzer, the "crossed data" is not in a format suitable for the logic analyzer to process.

Complicating matters is the fact that the debug bus must be able to carry debug data from multiple frequency domains in parallel. Meaning, the debug bus may carry full frequency data types, half frequency data types, and crossed data at the same time. A challenge found is processing the debug data in parallel when they include different data types because each type of debug data requires different reconstruction.

What is needed is a system and method to identify an original clock domain of each data segment on the debug bus and reconfigure the data such that the logic analyzer may process the data in a full frequency domain.

SUMMARY

It has been discovered that the aforementioned challenges are resolved using a system and method for reconstructing debug data that originates in a half frequency domain, or passes through a half frequency domain, in order to process the debug data in a full frequency domain. A logic analyzer receives debug data and determines whether the debug data is a full frequency data type, a half frequency data type, or a crossed data type. Once determined, the logic analyzer reconstructs the debug data such that debug condition-matching logic may process the reconstructed data in a full frequency domain.

A device includes partitions that operate in full frequency domains and half frequency domains. In addition, the device includes a debug bus ramp controller, a debug bus manager, and a logic analyzer. The debug bus manager manages debug data that loads onto the debug bus ramp controller. Once loaded, the debug bus manager sets control register bits in the logic analyzer based upon the data type for each "segment" within the debug bus ramp controller. The control register bits correspond to a crossed data signal, a half frequency domain signal, and a phase generator signal.

The logic analyzer activates the crossed data signal for segments that include crossed data types, which are debug data that originates in a full frequency domain and passes through a half frequency domain. The logic analyzer activates the half frequency domain signal for segments that include half frequency data types. And, the logic analyzer invokes the phase generator signal for segments that include half frequency data types or crossed data types.

For half frequency data types, the logic analyzer adds masked data values to the data in order to reconstruct the data to the full frequency domain before processing the data. For crossed data types, the logic analyzer reconstructs the data into its original format before processing the data in a full frequency domain. For full frequency data types, the logic analyzer does not perform reconstruction steps since the full frequency data type originated in a full frequency domain and did not pass through a half frequency domain.

In one embodiment, a separate logic analyzer control register may enable a "half frequency trace mode." This mode is useful when the data on all four channels, for example, originates from a half-frequency domain. Since data capture occurs at full frequency, each cycle of data from a half-frequency domain would normally occupy two entries in a trace array. By enabling the half frequency trace mode, the phase generator inhibits data capture into the trace array every other cycle, allowing more cycles of data to be stored in the trace array for subsequent analysis.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 1 is a diagram showing a logic analyzer processing data from multiple clock domains;

FIG. 2 is a diagram showing a logic analyzer processing data based upon particular data types;

FIG. 3 is a diagram showing data manipulation logic reconstructing data that originated from a full frequency domain passed through a half frequency domain;

FIG. 4 is a diagram showing multiplexer control logic receiving debug bus control register signals and providing various multiplexer control signals to data manipulation logic;

FIG. 5 is a diagram showing data manipulation logic processing data segments corresponding to various data types;

FIG. 6A is a table showing data from various partitions loading into a debug bus ramp controller;

FIG. 6B is a table showing channel data after data manipulation logic reconstructs the channel data;

FIG. 7 is a flowchart showing steps taken in identifying a data type corresponding to a data segment and setting control register bits accordingly;

FIG. 8 is a flowchart showing steps taken in processing a data segment based upon the data segment's corresponding data type;

FIG. 9A is a timing diagram showing control signals and data channels when processing full frequency data types;

FIG. 9B is a timing diagram showing control signals and data channels when processing half frequency data types;

FIG. 9C is a timing diagram showing control signals and data channels when processing crossed data types; and FIG. 10 is a block diagram of a computing device capable of implementing the present invention.

DETAILED DESCRIPTION

The following is intended to provide a detailed description of an example of the invention and should not be taken to be limiting of the invention itself. Rather, any number of variations may fall within the scope of the invention, which is defined in the claims following the description.

FIG. 1 is a diagram showing a logic analyzer processing data from multiple clock domains. Device 100 includes partition A 120, partition B 130, partition C 140, and partition D 150. Partition A 120 and partition C 140 operate a "first," or full frequency domain, which runs at a particular clock cycle. Partition B 130 and partition D 150 operate at a "second," or half frequency domain, which operates at a clock cycle that is half the full frequency domain's clock cycle. As one skilled in the art can appreciate, the invention described herein is applicable to multiple frequency domains in addition to a "full" and "half" frequency domain. For example, a device may include frequency domains that are in multiples of one-forth of a full frequency domain.

Partition A 120 functions in a full frequency domain and provides full frequency data types (data A 125) to debug bus ramp controller 160. Partition B 130 functions in a half frequency domain and provides half frequency data types (data B 135) to debug bus ramp controller 160. Partition C 140 functions in a full frequency domain and produces full frequency data types (data C 145). Data C 145 passes through partition D 150, which functions in the half frequency domain, and translates data C 145 to a crossed data type (crossed data C 155) in order to preserve each of the data bits. As a result of preserving each of the data bits, however, crossed data C 155 results in a different format than data C 145 (see FIG. 3 and corresponding text for further details). Partition D 150 also generates its own data and provides half frequency data types (data D 158) to debug bus ramp controller 160.

Debug bus manager 165 loads data A 125, data B 135, crossed data C 155, and data D 158 into particular "segments" included in debug bus ramp controller 160 at particular intervals. Debug bus manager 165 then selects one or more of the data segments and identifies the data type included in the selected segment (e.g., full frequency data type, half frequency data type, or crossed data type). In turn, debug bus manager 165 configures control bits within logic analyzer 170 to process the data segments accordingly in order to prepare each data segment for further processing in the full frequency domain.

Logic analyzer 170 is not required to perform reconstruction steps on data A 125 since data A 125 originated in a full frequency domain (partition A 120) and did not pass through a half frequency domain, thus keeping its original format. Data B 135 originated in a half frequency domain and, therefore, logic analyzer 170 adds masked data values to data B 135 in order to transform data b 135 to the full frequency domain (see FIGS. 5-9, and corresponding text for further details). Crossed data C 155 originated in a full frequency domain (partition C 140) and was translated into a crossed data type when passing through partition D 150. As such, logic analyzer 170 reconstructs crossed data C 155 into its original format before processing the data in a full frequency domain (see FIGS. 4, 5, and corresponding text for further details). For example, data C 145 may originate in a 32-bit format, which may convert to a 64-bit format (crossed data C 155). In this example, logic analyzer 170 reconstructs crossed data C 155 back to a 32-bit format (see FIG. 3 and corresponding text for further details).

Figure 2:
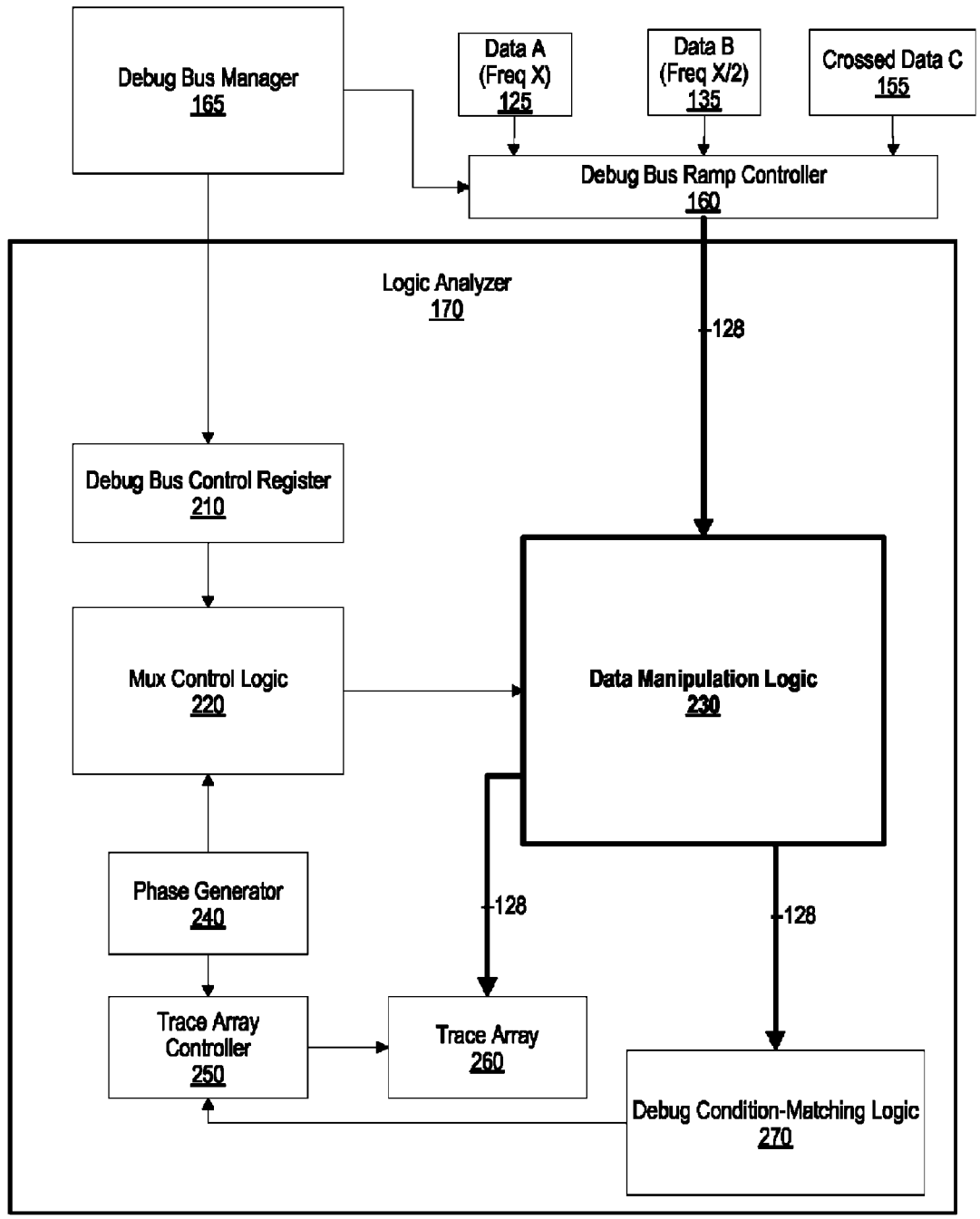

FIG. 2 is a diagram showing a logic analyzer processing data based upon particular data types. Logic analyzer 170 includes data manipulation logic 230, which reconstructs data based upon its data type. Data A 125 is a full frequency data type and is ready for processing in the full frequency domain. Therefore, data manipulation logic 230 is not required to perform reconstruction steps on data A 125. Data manipulation logic 230 is required, however to perform data manipulation steps on data B 135 and crossed data C 155 in order to prepare the data for processing in the full frequency domain. Logic analyzer 170, data A 125, data B 135, and crossed data C 155 are the same as that shown in FIG. 1.

Debug bus manager 165 determines what data type debug bus ramp controller 160 should receive, and configures debug bus control register 210 appropriately. For example, debug bus manager 165 may determine that data A 125 should load into "segment 0" of debug bus ramp controller 160, data B 135 should load into "segment 1" of debug bus ramp controller 160, and crossed data C 155 should load into "segment 2" and "segment 3" of debug bus ramp controller 160. In this example, debug bus manager 165 configures control bits included in debug bus control register 210 accordingly. Debug bus manager 165 and debug bus ramp controller 160 are the same as that shown in FIG. 1.

Mux control logic 220 receives signals from debug bus control register 210 and phase generator 240. In turn, mux control logic 220 generates multiplexer control signals that control input and output multiplexers included in data manipulation logic 230. Debug bus control register 210 provides signals such as a "crossed data" signal and a "half frequency domain" signal for particular segments included in debug bus ramp controller 160. The crossed data signal is high when a corresponding segment includes crossed data, such as crossed data C 155. The half frequency domain data signal is high when a corresponding segment includes data that originated in a half frequency domain, such as data B 135.

Phase generator 240 provides a phase generator signal, which alternates from low (phase A) to high (phase B). Mux control logic 220 uses the phase generator signal to control data manipulation logic 230's multiplexers when a corresponding segment includes half frequency type data or crossed data type data (see FIGS. 8, 9, and corresponding text for further details).

Data manipulation logic 230 provides reconstructed data to trace array 260 and debug condition-matching logic 270. Debug condition-matching logic 270 may generate a trigger to trace array controller 250 to start capturing channel data into trace array 260. The captured data comes from channel data within data manipulation logic 230 (see FIG. 5 and corresponding text for further details).

In one embodiment, a separate logic analyzer control register may enable a "half frequency trace mode." This mode is useful when the data on all four channels originates from a half-frequency domain. Since the data capture occurs at full frequency, each cycle of data from a half-frequency domain occupies two entries in trace array 260, which may be wasteful. By enabling the half frequency trace mode, phase generator 240 inhibits data capture into trace array 260 every other cycle, allowing more cycles of data to be stored in trace array 260 for subsequent analysis.

Figure 3:
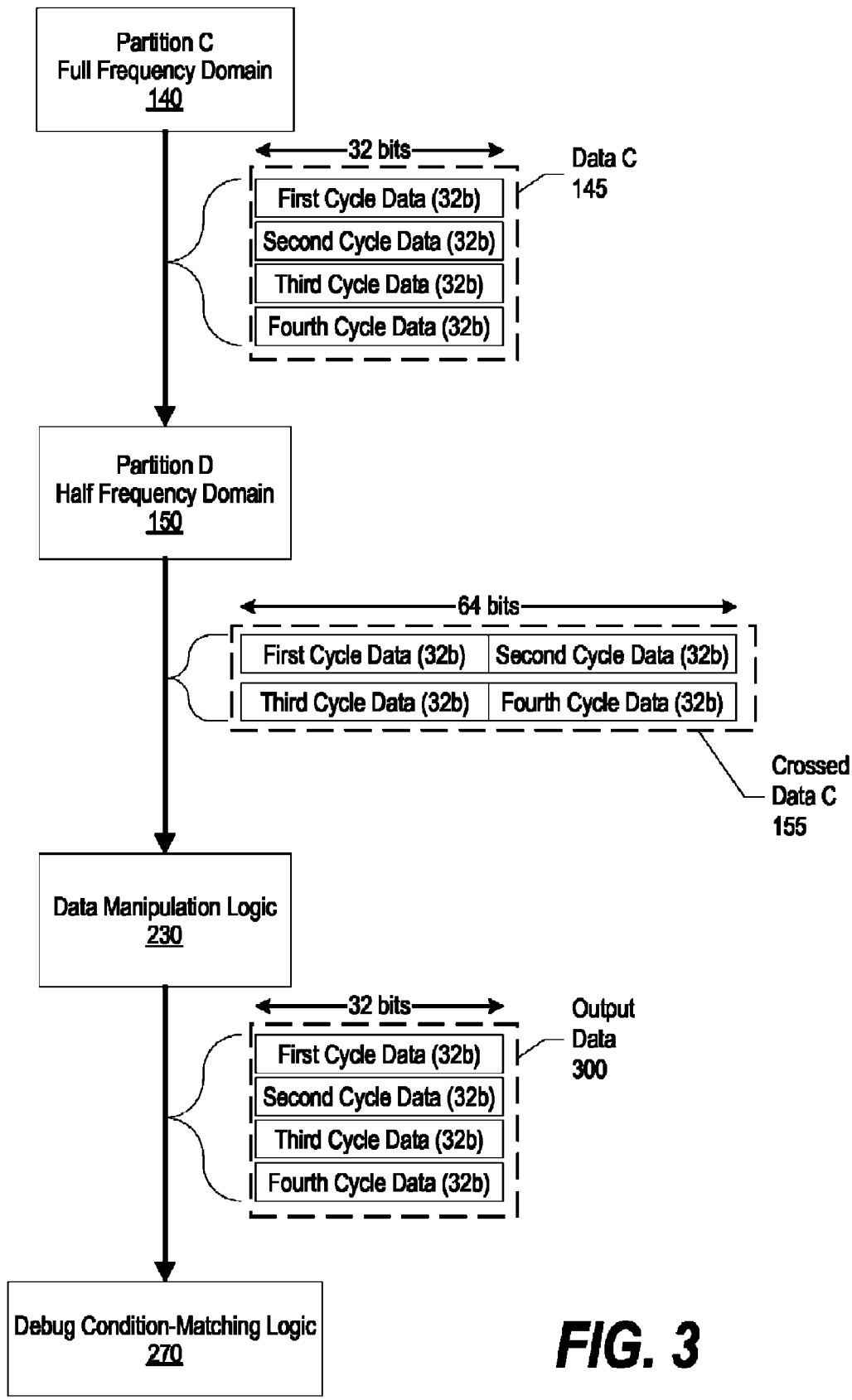

FIG. 3 is a diagram showing data manipulation logic reconstructing data that originated from a full frequency domain passed through a half frequency domain.

Partition C 140 functions in a full frequency domain and produces data C 145, which are multiple cycles of data (first through fourth cycle). As can be seen in the example shown in FIG. 3, each of data C 145's cycles comprises 32 bits of data. Data C 145 then passes through partition D 150, which functions in a half frequency domain. In order to preserve each of the bits included in data C 145 as it propagates through partition D 150, 64 bits are allocated for each cycle. As such, data from the odd cycles get assigned to bits 0:31 (leftmost), and the data from the even cycles get assigned to bits 32-63 (rightmost). Thus, crossed data C 155 shows data C 145's second cycle data is appended to its first cycle data, and data C 145's fourth cycle data is appended to its third cycle data. Partition C 140, data C 145, partition D 150, and crossed data C 155 are the same as that shown in FIG. 1.

Data manipulation logic 230 receives crossed data C 155 and reconstructs the data back to its original 32-bit format (output data 300). This allows debug condition-matching logic 270 to detect patterns for triggering an event. For example, three consecutive '0' values in bit 0 (leftmost bit) followed by a '1' value in bits 4 and 5 are detectable in the data's original format, but are not easily detectable in the expanded format (data 320). Data manipulation logic 230 and debug condition-matching logic 270 are the same as that shown in FIG. 2.

Figure 4:
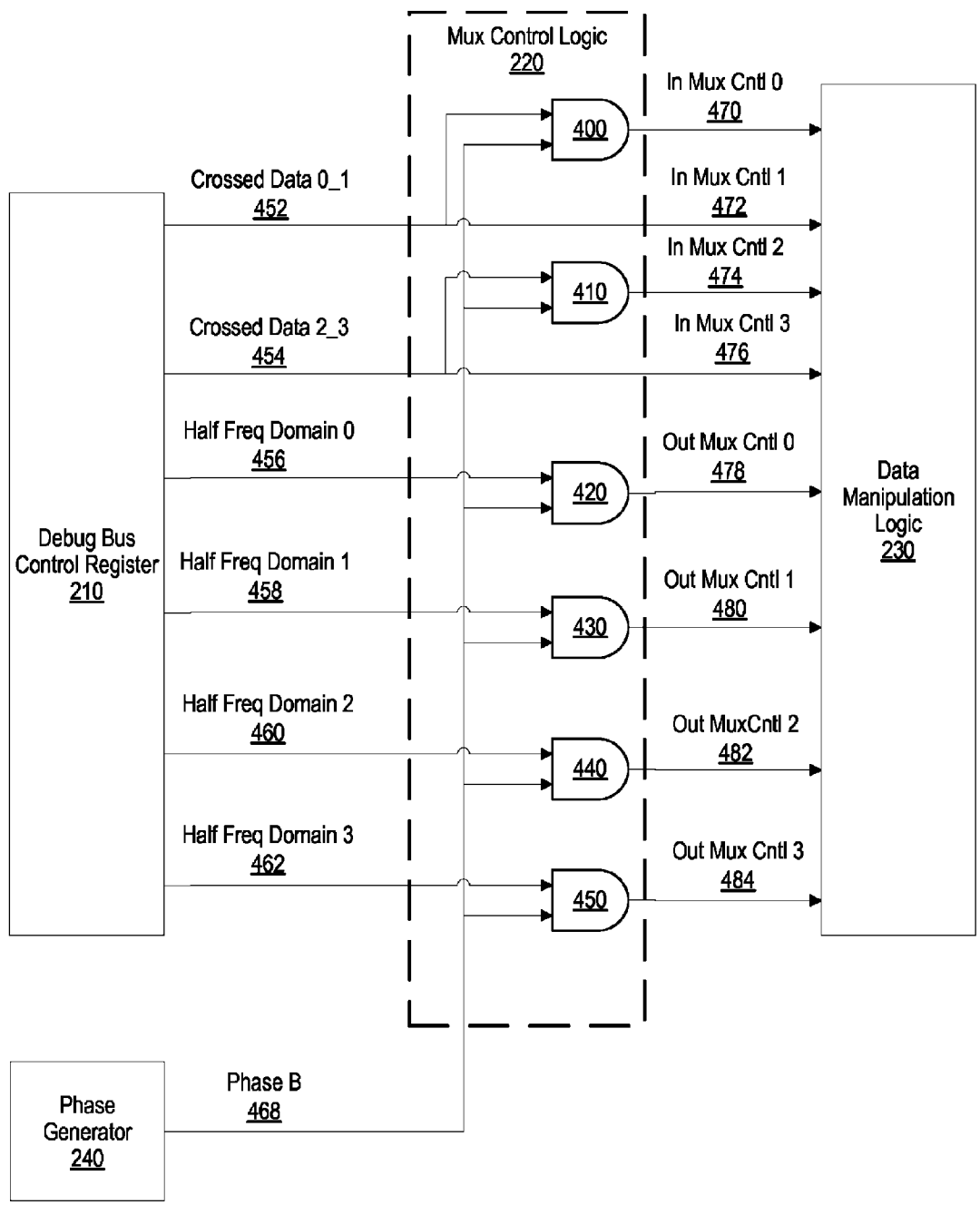

FIG. 4 is a diagram showing multiplexer control logic receiving debug bus control register signals and providing various multiplexer control signals to data manipulation logic. Mux control logic 220 comprises gates 400 through 450. Gates 400 through 450 receive control signals from debug bus control register 210, a phase generator signal (phase B 468) from phase generator 240, and produce a multiplexer control signal that are sent to data manipulation logic 230 for controlling input multiplexers and output multiplexers (see FIG. 5 and corresponding text for further details). Debug bus control register 210, data manipulation logic 230, and phase generator 240 are the same as that shown in FIG. 3.

Crossed data signals 0_1 452 and 2_3 454 are low when corresponding segment data is not crossed data, such as when segment data is a full frequency data type or a half frequency data type. Crossed data signal 0_1 452 influence input multiplexers 520 and 525 shown in FIG. 5. When crossed data signal 0_1 452 is low, both input mux control signal 0 470 and input mux control signal 1 472 are low, regardless of the value of phase B 468. However, when crossed data signal 0_1 452 is high, indicating that the data is crossed data, input mux control signal 1 472 is high and input mux control signal 0 470 mirrors the value of phase B 468. Meaning, input mux control signal 0 470 is high when phase B 468 is high, and is low when phase B 468 is low (see FIG. 9 and corresponding text for further details).

Figure 5:
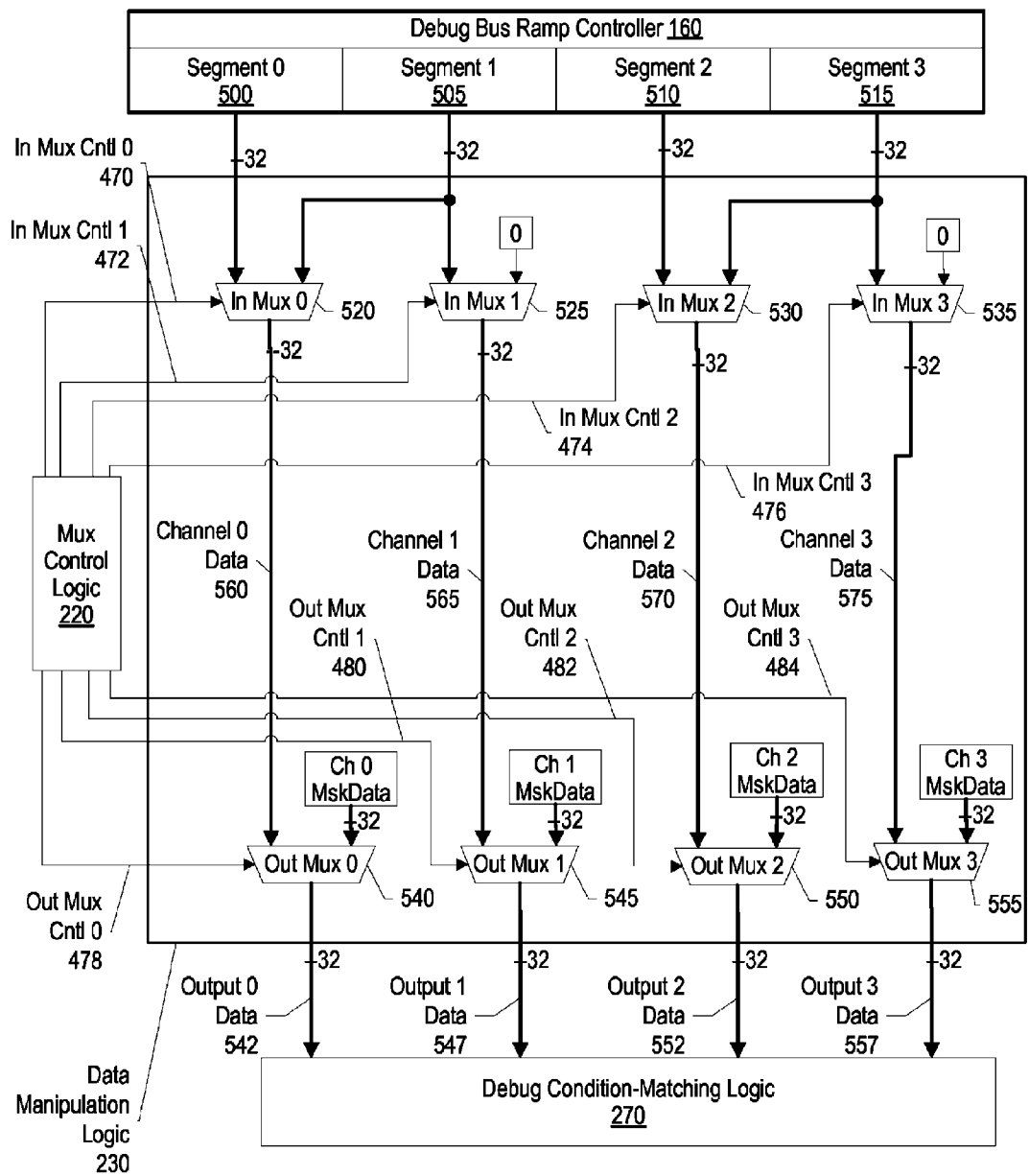

Likewise, crossed data signal 2_3 454 influence input multiplexers 530 and 535 shown in FIG. 5. When crossed data signal 2_3 is low, both input mux control signal 2 474 and input mux control signal 3 476 are low, regardless of the value of phase B 468. However, when crossed data signal 2_3 454 is high, indicating that the data in segments 2 510 and 3 515 are crossed data, input mux control signal 3 476 remains high and input mux control signal 2 474 follows the value of phase B 468.

Moving on to control signals that control data manipulation logic 230's output multiplexers, gates 420 through 450 produce control signals for multiplexers 540 through 555 (shown in FIG. 5). Each of gates 420 through 450 receives phase B signal 468 as an input, and half frequency domain signals 456 through 462 as another input. In turn, gates 420 through 450 generate output mux control signals 0 478 through 3 484. When a data segment includes data that originated in a half frequency domain, debug bus control register 210's corresponding half frequency domain signal is set to high. This causes the corresponding output multiplexer's control signal to be high when phase B 468 is high, and low when phase B 468 is low (see FIG. 9 and corresponding text for further details).

FIG. 5 is a diagram showing data manipulation logic processing data segments corresponding to various data types. Data manipulation logic 230 receives data from debug bus ramp controller 160 and control signals from mux control logic 220. In turn, data manipulation logic 230 reconstructs the received data in order for debug condition-matching logic 270 to process the data in a full frequency domain. Data manipulation logic 230, debug bus ramp controller 160, mux control logic 220, and debug condition-matching logic 270 are the same as that shown in FIG. 2.

Data manipulation logic 230 includes input multiplexers 520 through 535, which are controlled by input multiplexer control signals 470 through 476, respectively. Input multiplexers 520 through 535 provide data to logic channel data 0 560 through 3 575, respectively. When an input multiplexer's control signal is low, the multiplexer passes segment bits from debug bus ramp controller 160's corresponding segment onto its respective channel. For example, when input mux control 0 470 is low, multiplexer 520 passes segment bits from segment 0 500 onto channel 0 data 560. When a multiplexer control signal is high, the multiplexer passes bits from the multiplexer's other input. Using the example described above, when input multiplexer control signal 0 470 is high, multiplexer 520 passes segment bits from segment 1 505 onto channel 0 data 560.

An input multiplexer's control signal is low when 1) its corresponding segment data is a full frequency type, 2) its corresponding segment data is a half frequency type, or 3) every other cycle when its corresponding segment data is a crossed data type. For example, when segment 0 500 includes full frequency data, multiplexer 520 passes the full frequency data onto channel 0 data 560 because no reconstruction is required. In another example, when segment 0 500 and segment 1 505 include crossed data, input multiplexer 520 first passes a data segment bit from segment 0 500 onto logic analyzer channel 0 560, and then passes a data segment bit from segment 1 505 onto logic analyzer channel 0 560. This alternation reconfigures the crossed data back to its original format (see FIG. 9 and corresponding text for further details).

Data manipulation logic 230 also includes output multiplexers 540 through 555, which are controlled by output multiplexer control signals 478 through 484, respectively. Output multiplexers 540 through 555 provide data to debug condition-matching logic 270 that is ready for processing in the full frequency domain. When an output multiplexer's control signal is low, the output multiplexer passes data from its respective channel data to debug condition-matching logic 270. For example, when output mux control 0 478 is low, multiplexer 540 passes data from channel 0 data 560 to debug condition-matching logic 270. When an output multiplexer's control signal is high, the output multiplexer passes masked data that is logically determined as the opposite of what condition-matching logic 270 considers being a match (see FIG. 9 and corresponding text for further details).

In one embodiment, channel 0 data 560 through channel 3 data 575 also pass to a trace array, such as trace array 260 shown in FIG. 2. In this embodiment, debug condition-matching logic 270 may generate a trigger to start capturing the logic analyzer channel data into the trace array (see FIG. 2 and corresponding text for further details).

FIG. 6A is a table showing data from various partitions loading into a debug bus ramp controller. Table 600 include bus segment 0 605 through 3 620, which correspond to segment 0 500 through 3 515 shown in FIG. 5, respectively.

Row 625 shows that each bus segment includes a word from partition A, which are full frequency data types (generated in the full frequency domain). Row 630 shows that each bus segment includes a word from partition B, which are half frequency data types (generated in the half frequency domain). Row 635 shows that each bus segment includes crossed data. As can be seen, bus segment 0 605 includes partition C word 0 phase A and bus segment 1 includes partition C word 0 phase B. Data manipulation logic reconstructs this data to its original form (see FIG. 6B and corresponding text for further details). Row 640 shows that each bus segment includes a word from partition D, which are half frequency data types.

FIG. 6B is a table showing channel data in a given cycle after data manipulation logic reconstructs the channel data. Table 650 includes channel data columns 655 through 670. As can be seen, rows 625, 630, and 640 from FIG. 6A transform into rows 675, 680, and 690 without format changes, while row 635 from FIG. 6A transforms into row 685 with format changes. This is due to the fact that since partition C's data is crossed data, the data manipulation logic reconfigures the 64 bit data back to its original form of 32 bit data. Therefore, partition C word 0 (column 655) represents any of the rows of output data 300 from FIG. 3. The first four full-frequency cycles of column 655 row 685 from FIG. 6B will contain first cycle data, second cycle data, third cycle data, and fourth cycle data in succession.

Figure 7:
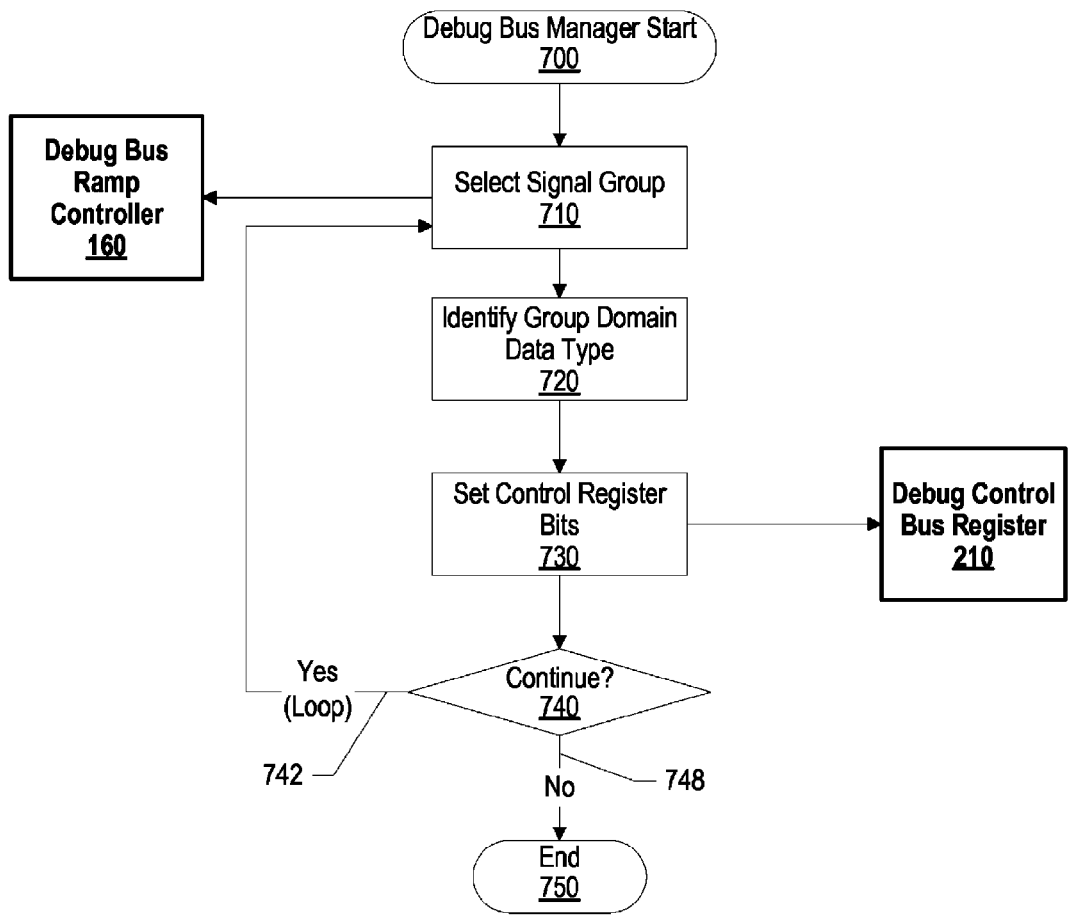

FIG. 7 is a flowchart showing steps taken in identifying a data type corresponding to a data segment and setting control register bits accordingly.

Processing commences at 700, whereupon processing selects a signal group in debug bus ramp controller 160 (step 710). At step 720, processing identifies a data type that corresponds to the signal group, such as a half frequency data type, a full frequency data type, and a crossed data type. Half frequency data types originate in a half frequency domain. Full frequency data types originate in a full frequency domain. And, crossed data types originate in a full frequency domain and pass through a half frequency domain. Debug bus ramp controller 160 is the same as that shown in FIG. 1.

Processing sets particular control bits in debug control register 210 at step 730 based upon the identified data type. The control bits correspond to a crossed data signal and a half frequency domain signal, which multiplexer control logic uses to instruct multiplexers as to which input to select when processing data segments included in debug bus ramp controller (see FIGS. 4, 5, and corresponding text for further details).

A determination is made as to whether to continue to select data segments and set control register bits (decision 740). If processing should continue, decision 740 branches to "Yes" branch 742, which loops back to select more data segments and set more control register bits. This looping continues until processing should terminate, at which point decision 740 branches to "No" branch 748 whereupon processing ends at 750.

Figure 8:
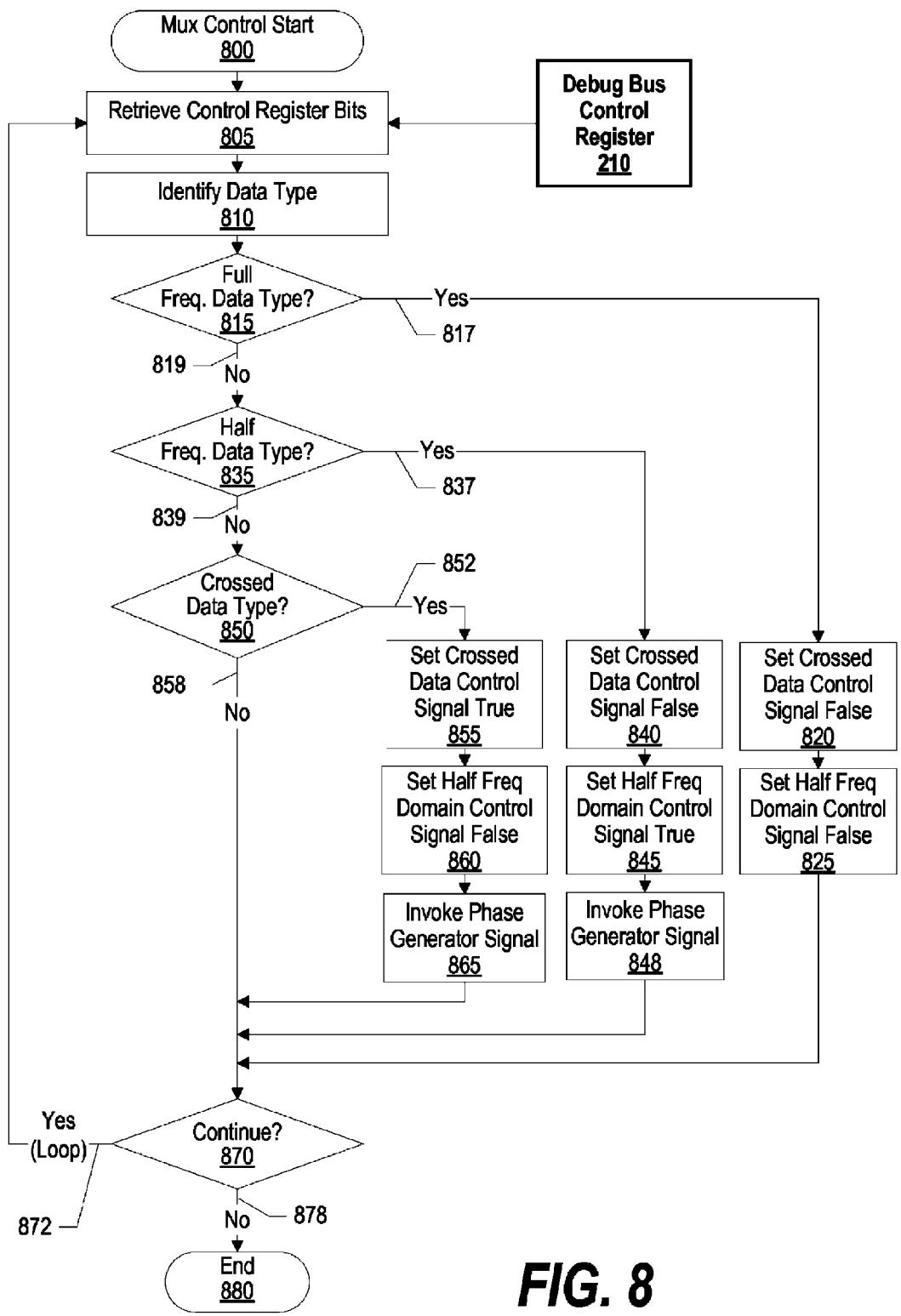

FIG. 8 is a flowchart showing steps taken in processing a data segment based upon the data segment's corresponding data type. Processing commences at 800, whereupon processing retrieves control register bits stored in debug bus control register 210 (step 805). The control register bits were previously stored in debug bus control register 210 by a debug bus manager (see FIG. 7 and corresponding text for further details). At step 810, processing identifies whether the data type corresponding to the control register bits is a full frequency data type, a half frequency data type, or a crossed data type.

A determination is made as to whether the identified data type is a full frequency data type (decision 815). If the identified data type is a full frequency data type, decision 815 branches to "Yes" branch 817 whereupon processing sets the crossed data control signal to false at step 820 since the data is not crossed data. At step 825, processing sets the half frequency domain signal to false since the data originated in the full frequency domain. As such, the output multiplexers select the data segment bits on each clock cycle, thus passing through the data segment bits to the debug condition-matching logic as is.

On the other hand, if the identified data type is not a full frequency data type, decision 835 branches to "No" branch 839 whereupon a determination is made as to whether the identified data type is a half data type (decision 835). Half data types are data that originate in a half frequency domain, which processing converts to a full frequency domain before processing the data. If the identified data type is a half frequency data type, decision 835 branches to "Yes" branch 837 whereupon processing sets a crossed data control signal to false at step 840. The crossed data control signal is set to false in order for data to pass through an input multiplexer unaltered to a logic analyzer channel (see FIGS. 4, 5, 9, and corresponding text for further details). At step 845, processing sets a second frequency domain data signal to true and, at step 848, processing invokes a phase generator signal. The half frequency domain signal and the phase generator signal are used in combination with each other to select between data segment bits and masked values depending upon whether the phase generator signal is high or low (see FIGS. 4, 5, 9, and corresponding text for further details).

On the other hand, if the identified data type is not a half frequency data type, decision 835 branches to "No" branch 839 whereupon a determination is made as to whether the identified data type is a crossed data type (decision 850). If the identified data type is a crossed data type, decision 850 branches to "Yes" branch 852 whereupon processing sets the crossed data control signal to true at step 855 since the data is crossed data, which is data that originated in the full frequency domain and converted to the half frequency domain when passing through the half frequency domain. Processing sets the crossed data control signal to true in order to reconstruct data segments back to their original format by selecting data segment bits from different data segments on alternating clock cycles. At step 860, processing sets the half frequency domain signal to false and, at step 865, processing invokes the phase generator signal, which is used in conjunction with the crossed data signal for selecting data segment bits at the input multiplexers.

A determination is made as to whether processing should continue (decision 870). If processing should continue, decision 870 branches to "Yes" branch 872, which loops back to process more control register bits. This looping continues until processing should terminate, at which point decision 870 branches to "No" branch 878, whereupon processing ends at 880.

FIG. 9A is a timing diagram showing control signals and data channels when processing full frequency data types. When the logic analyzer, which processes data in a full frequency domain, receives data that originates from a full frequency domain, the logic analyzer need not perform reconstruction on the data. FIG. 9A shows various control signals and data paths that are shown in FIGS. 4 and 5.

When processing full frequency data types, crossed data 0_1 signal 452 is low because the data is not crossed data, and phase B signal 468 is low because the data did not cross through a half frequency domain. As such, input mux control 0 signal 470 remains low because the signal is the result of crossed data 0_1 signal 452 AND'ed with phase B signal 468. Therefore channel 0 data 560 is segment 0 data (from segment 0 500 shown in FIG. 5).

As can be seen in FIG. 5, channel 0 data 560 feeds into multiplexer 540, which output mux control 0 signal 478 controls. FIG. 9A shows that half frequency domain 0 signal 456 is low because the data did not originate in a half frequency domain. As such, output mux 0 control signal 478 remains low because the signal is the result of half frequency domain 0 signal 456 AND'ed with Phase B signal 468. As a result, output 0 data 542 is segment 0 data, which is the original format as the full frequency data that was input to the data manipulation logic.

FIG. 9B is a timing diagram showing control signals and data channels when processing half frequency data types. When the logic analyzer processes data that originates from a half frequency domain, the logic analyzer reconstructs the data such that the data is not double-counted. Therefore, data manipulation logic masks data on alternating cycles. To accomplish this, the data manipulation logic uses a phase generator signal that alternates from phase "A" to phase "B." During phase A, the channel data passes through directly. During phase B, the data manipulation logic selects masked data, which is logically determined as the opposite of what condition-matching logic considers being a match.

When processing half frequency data types, crossed data 0_1 signal 452 is low since the half frequency domain data is not crossed data, and phase B signal 468 is invoked because the data originated in the half frequency domain. As such, input mux control 0 signal 470 remains low because the signal is the result of crossed data 0_1 signal 452 AND'ed with phase B signal 468. Therefore channel 0 data 560 is segment 0 data (from segment 0 500 shown in FIG. 5).

As can be seen in FIG. 5, channel 0 data 560 feeds into multiplexer 540, which is controlled by output mux control 0 signal 478. FIG. 9B shows that half frequency domain 0 signal 456 is high because the data originated in a half frequency domain. As such, output mux 0 control signal 478 mirrors phase B signal 468 because the signal is the result of half frequency domain 0 signal 456 AND'ed with phase B signal 468. As a result, output 0 data 542 alternates between segment 0 data (when phase B 468 is low) and masked data (when phase B 468 is high). As a result, the half frequency domain data is reconstructed into a format that the debug condition-matching logic may process in the full frequency domain.

FIG. 9C is a timing diagram showing control signals and data channels when processing crossed data types. When the logic analyzer processes data that originates from a full frequency domain and crosses through a half frequency domain, the logic analyzer reconstructs the data back to its original format. To accomplish this, 64 bits of crossed data are "folded" back into its original 32-bit format by utilizing a phase generator signal that alternates from phase "A" to phase "B." During phase A, data manipulation logic selects segment data that includes "phase A" data included in segment 0 (shown in FIG. 5). During phase B, the data manipulation logic selects different segment data that includes "phase B" data included in segment 1 (shown in FIG. 5).

When processing crossed data, crossed data 0_1 signal 452 is high since the data is crossed data, and phase B signal 468 is invoked because the data is received at the half frequency domain data rate. As such, input mux control 0 signal 470 mirrors phase B signal 468 because the signal is the result of crossed data 0_1 signal 452 AND'ed with phase B signal 468. Therefore channel 0 data 560 alternates between segment 0 data and segment 1 data (from segment 0 500 and segment 505 shown in FIG. 5, respectively).

As can be seen in FIG. 5, channel 0 data 560 feeds into multiplexer 540, which is controlled by output mux control 0 signal 478. FIG. 9C shows that half frequency domain 0 signal 456 is low because the data originated in a full frequency domain. As such, output mux 0 control signal 478 remains low because the signal is the result of half frequency domain 0 signal 456 AND'ed with phase B signal 468. In turn, multiplexer 540 passes through channel 0 data 560 as output 0 data 542. As a result, the crossed data is reconstructed back to its original format that debug condition-matching logic may process in the full frequency domain.

FIG. 10 illustrates information handling system 1001 which is a simplified example of a computer system capable of performing the computing operations described herein. Computer system 1001 includes processor 1000 which is coupled to host bus 1002. A level two (L2) cache memory 1004 is also coupled to host bus 1002. Host-to-PCI bridge 1006 is coupled to main memory 1008, includes cache memory and main memory control functions, and provides bus control to handle transfers among PCI bus 1010, processor 1000, L2 cache 1004, main memory 1008, and host bus 1002. Main memory 1008 is coupled to Host-to-PCI bridge 1006 as well as host bus 1002. Devices used solely by host processor(s) 1000, such as LAN card 1030, are coupled to PCI bus 1010. Service Processor Interface and ISA Access Pass-through 1012 provides an interface between PCI bus 1010 and PCI bus 1014. In this manner, PCI bus 1014 is insulated from PCI bus 1010. Devices, such as flash memory 1018, are coupled to PCI bus 1014. In one implementation, flash memory 1018 includes BIOS code that incorporates the necessary processor executable code for a variety of low-level system functions and system boot functions.

PCI bus 1014 provides an interface for a variety of devices that are shared by host processor(s) 1000 and Service Processor 1016 including, for example, flash memory 1018. PCI-to-ISA bridge 1035 provides bus control to handle transfers between PCI bus 1014 and ISA bus 1040, universal serial bus (USB) functionality 1045, power management functionality 1055, and can include other functional elements not shown, such as a real-time clock (RTC), DMA control, interrupt support, and system management bus support. Nonvolatile RAM 1020 is attached to ISA Bus 1040. Service Processor 1016 includes JTAG and I2C busses 1022 for communication with processor(s) 1000 during initialization steps. JTAG/I2C busses 1022 are also coupled to L2 cache 1004, Host-to-PCI bridge 1006, and main memory 1008 providing a communications path between the processor, the Service Processor, the L2 cache, the Host-to-PCI bridge, and the main memory. Service Processor 1016 also has access to system power resources for powering down information handling device 1001.

Peripheral devices and input/output (I/O) devices can be attached to various interfaces (e.g., parallel interface 1062, serial interface 1064, keyboard interface 1068, and mouse interface 1070 coupled to ISA bus 1040. Alternatively, many I/O devices can be accommodated by a super I/O controller (not shown) attached to ISA bus 1040.

In order to attach computer system 1001 to another computer system to copy files over a network, LAN card 1030 is coupled to PCI bus 1010. Similarly, to connect computer system 1001 to an ISP to connect to the Internet using a telephone line connection, modem 10105 is connected to serial port 1064 and PCI-to-ISA Bridge 1035.

While FIG. 10 shows one information handling system that employs processor(s) 1000, the information handling system may take many forms. For example, information handling system 1001 may take the form of a desktop, server, portable, laptop, notebook, or other form factor computer or data processing system. Information handling system 1001 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:
   generating a first data segment and a second data segment using a first clock rate corresponding to a first frequency domain;
   passing the first data segment and the second data segment through a second frequency domain corresponding to a second clock rate;
   in response to passing through the second frequency domain, translating the first data segment and the second data segment into crossed data that operates at the second clock rate;
   detecting that the crossed data is a crossed data type;
   in response to detecting that the crossed data is a crossed data type, reconstructing the crossed data using the first clock rate, the reconstructing resulting in a reconstructed first data segment and a reconstructed second data segment; and
   processing the reconstructed first data segment and the reconstructed second data segment in the first frequency domain corresponding to the first clock rate.

2. The method of claim 1 wherein the reconstructing further comprises:
   setting a crossed data signal;
   invoking a phase generator signal that alternates between inactive and active;
   in response to the setting of the crossed data signal, selecting a first data segment bit included in the crossed data when the phase generator signal is inactive, and selecting a second data segment bit included in the crossed data when the phase generator signal is active, the first data segment bit included in the first data segment and the second data segment bit included in the second data segment; and
   providing the selected bits to a logic analyzer channel.

3. The method of claim 2 further comprising:
   setting a second frequency domain data signal;
   in response to setting the second frequency domain signal, selecting one of the selected bits from the logic analyzer channel when the phase generator signal is inactive, and selecting a masked value when the phase generator signal is active.

4. The method of claim 1 further comprising:
   in response to detecting a second frequency data type, deactivating a crossed data signal, setting a second frequency data control signal, and invoking a phase generator signal;
   in response to detecting a first frequency data type, deactivating the crossed data signal, and deactivating the second frequency data control signal; and
   in response to detecting a crossed data type, setting the crossed data signal, deactivating the second frequency data control signal, and invoking the phase generator signal.

5. The method of claim 4 wherein the crossed data signal and the second frequency data control signal are control register bits.

6. The method of claim 1 wherein the translating results in the second data segment appended to the first data segment.

7. The method of claim 1 further comprising:
   wherein the first frequency domain is a full frequency domain and the second frequency domain is a half frequency domain; and
   wherein the second clock rate is half as fast as the first clock rate.

8. The method of claim 1 further comprising:
   receiving a plurality of data segments that originated in the second frequency domain; and
   in response to receiving the plurality of data segments that originated in the second frequency domain, enabling a half frequency trace mode that inhibits bit capture every other clock cycle.

9. A computer-implemented method comprising:
   receiving a first data segment originally generated in a first frequency domain;

converting the first data segment from the first frequency domain to a second frequency domain, resulting in a converted first data segment;

receiving a second data segment at the first frequency domain, the second data segment originally generated in the second frequency domain;

in response to receiving the second data segment at the first frequency domain, translating the second data segment from a second frequency domain to the first frequency domain, resulting in a crossed data segment;

converting the crossed data segment from the first frequency domain back to the second frequency domain, resulting in a converted second data segment; and simultaneously processing the converted first data segment and the converted second data segment using the second frequency domain.

10. An information handling system comprising:
one or more processors;
a memory accessible by the processors;
one or more nonvolatile storage devices accessible by the processors; and
a set of instructions stored in the memory, wherein one or more of the processors executes the set of instructions in order to perform actions of:
generating a first data segment and a second data segment using a first clock rate corresponding to a first frequency domain;
passing the first data segment and the second data segment through a second frequency domain corresponding to a second clock rate;
in response to passing through the second frequency domain, translating the first data segment and the second data segment into crossed data that operates at the second clock rate;
detecting that the crossed data is a crossed data type;
in response to detecting that the crossed data is a crossed data type, reconstructing the crossed data using the first clock rate, the reconstructing resulting in a reconstructed first data segment and a reconstructed second data segment; and
processing the reconstructed first data segment and the reconstructed second data segment in the first frequency domain corresponding to the first clock rate.

11. The information handling system of claim 10 further comprising an additional set of instructions in order to perform actions of:
setting a crossed data signal;
invoking a phase generator signal that alternates between inactive and active;
in response to the setting of the crossed data signal, selecting a first data segment bit included in the crossed data when the phase generator signal is inactive, and selecting a second data segment bit included in the crossed data when the phase generator signal is active, the first data segment bit included in the first data segment and the second data segment bit included in the second data segment; and
providing the selected bits to a logic analyzer channel.

12. The information handling system of claim 11 further comprising an additional set of instructions in order to perform actions of:
setting a second frequency domain data signal;
in response to setting the second frequency domain signal, selecting one of the selected bits from the logic analyzer channel when the phase generator signal is inactive, and selecting a masked value when the phase generator signal is active.

13. The information handling system of claim 10 further comprising an additional set of instructions in order to perform actions of:
in response to detecting a second frequency data type, deactivating a crossed data signal, setting a second frequency data control signal, and invoking a phase generator signal;
in response to detecting a first frequency data type, deactivating the crossed data signal, and deactivating the second frequency data control signal; and
in response to detecting a crossed data type, setting the crossed data signal, deactivating the second frequency data control signal, and invoking the phase generator signal.

14. The information handling system of claim 10 further comprising:
wherein the first frequency domain is a full frequency domain and the second frequency domain is a half frequency domain; and
wherein the second clock rate is half as fast as the first clock rate.

15. A computer program product stored on a non-transitory tangible computer operable media, the non-transitory tangible computer operable media containing instructions for execution by a computer, which, when executed by the computer, cause the computer to implement a method of reconstructing logic analyzer data, the method comprising:
generating a first data segment and a second data segment using a first clock rate corresponding to a first frequency domain;
passing the first data segment and the second data segment through a second frequency domain corresponding to a second clock rate;
in response to passing through the second frequency domain, translating the first data segment and the second data segment into crossed data that operates at the second clock rate;
detecting that the crossed data is a crossed data type;
in response to detecting that the crossed data is a crossed data type, reconstructing the crossed data using the first clock rate, the reconstructing resulting in a reconstructed first data segment and a reconstructed second data segment; and
processing the reconstructed first data segment and the reconstructed second data segment in the first frequency domain corresponding to the first clock rate.

16. The computer program product of claim 15 wherein the method further comprises:
setting a crossed data signal;
invoking a phase generator signal that alternates between inactive and active;
in response to the setting of the crossed data signal, selecting a first data segment bit included in the crossed data when the phase generator signal is inactive, and selecting a second data segment bit included in the crossed data when the phase generator signal is active, the first data segment bit included in the first data segment and the second data segment bit included in the second data segment; and
providing the selected bits to a logic analyzer channel.

17. The computer program product of claim 16 wherein the method further comprises:
setting a second frequency domain data signal;
in response to setting the second frequency domain signal, selecting one of the selected bits from the logic analyzer channel when the phase generator signal is inactive, and selecting a masked value when the phase generator signal is active.

18. The computer program product of claim 15 wherein the method further comprises:
- in response to detecting a second frequency data type, deactivating a crossed data signal, setting a second frequency data control signal, and invoking a phase generator signal;
- in response to detecting a first frequency data type, deactivating the crossed data signal, and deactivating the second frequency data control signal; and
- in response to detecting a crossed data type, setting the crossed data signal, deactivating the second frequency data control signal, and invoking the phase generator signal.

19. The computer program product of claim 15 wherein the method further comprises:
- wherein the first frequency domain is a full frequency domain and the second frequency domain is a half frequency domain; and
- wherein the second clock rate is half as fast as the first clock rate.

\* \* \* \* \*